United States Patent
Knauf et al.

(10) Patent No.: US 11,703,770 B2
(45) Date of Patent: Jul. 18, 2023

(54) COMPENSATION OF CREEP EFFECTS IN AN IMAGING DEVICE

(71) Applicant: Carl Zeiss SMT GmbH, Oberkochen (DE)

(72) Inventors: Eylem Bektas Knauf, Aalen (DE); Ulrich Schoenhoff, Ulm (DE); Marwène Nefzi, Ulm (DE); Ralf Zweering, Aalen (DE); Konrad Carl Steimer, Mannheim (DE); Yim-Bun Patrick Kwan, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/354,212

(22) Filed: Jun. 22, 2021

(65) Prior Publication Data
US 2021/0405359 A1    Dec. 30, 2021

(30) Foreign Application Priority Data

Jun. 29, 2020 (DE) .................... 10 2020 208 011.9

(51) Int. Cl.
*G03F 7/20* (2006.01)
*G03F 7/00* (2006.01)

(52) U.S. Cl.
CPC .......... *G03F 7/709* (2013.01); *G03F 7/70483* (2013.01); *G03F 7/70825* (2013.01)

(58) Field of Classification Search
CPC ...................................................... G03F 7/709
See application file for complete search history.

(56) References Cited

U.S. PATENT DOCUMENTS

| 6,036,162 A | 3/2000 | Hayashi |
| 6,378,672 B1 * | 4/2002 | Wakui ..................... G03F 7/709 |
| | | 267/140.14 |

(Continued)

FOREIGN PATENT DOCUMENTS

| DE | 10 2008 032 853 A1 | 1/2010 |
| DE | 10 2016 208 008 A1 | 11/2017 |

(Continued)

OTHER PUBLICATIONS

Reiser et al., PIRest Technology—How to Keep the Last Position of PZT Actuators without Electrical Power, Actuator 2018: 16th International Conference on New Actuators, Bremen, Germany, Jun. 25-27, 2018 (Year: 2018).*

(Continued)

*Primary Examiner* — Steven Whitesell Gordon
(74) *Attorney, Agent, or Firm* — Fish & Richardson P.C.

(57) ABSTRACT

An arrangement of a microlithographic optical imaging device includes first and supporting structures. The first supporting structure supports an optical element of the imaging device. The first supporting structure supports the second supporting structure via supporting spring devices of a vibration decoupling device. The supporting spring devices act kinematically parallel to one another between the first and second supporting structures. Each supporting spring device defines a supporting force direction and a supporting length along the supporting force direction. The second supporting structure supports a measuring device configured to measure the position and/or orientation of the optical element in relation to a reference in at least one degree of freedom and up to all six degrees of freedom in space. A creep compensation device compensates a change in a static relative situation between the first and second (Continued)

supporting structures in at least one correction degree of freedom.

22 Claims, 3 Drawing Sheets

(56) References Cited

U.S. PATENT DOCUMENTS

| | | | |
|---|---|---|---|
| 10,209,634 | B2 | 2/2019 | Butler et al. |
| 10,386,732 | B2 | 8/2019 | Marsollek |
| 11,029,612 | B2 | 6/2021 | Kimman et al. |
| 11,415,895 | B2 | 8/2022 | Nefzi et al. |
| 2005/0105069 | A1 | 5/2005 | Loopstra et al. |
| 2008/0240501 | A1 | 10/2008 | Van Der Wijst et al. |
| 2010/0124724 | A1 | 5/2010 | Hoshino |
| 2010/0134770 | A1 | 6/2010 | Okamoto |
| 2011/0170078 | A1 | 7/2011 | Loopstra et al. |
| 2011/0299053 | A1 | 12/2011 | Steinbach et al. |
| 2012/0105819 | A1* | 5/2012 | Butler .................. G03F 7/709 355/72 |
| 2015/0235887 | A1 | 8/2015 | Van Lievenoogen et al. |
| 2017/0329238 | A1 | 11/2017 | Schoenhoff et al. |
| 2019/0079417 | A1 | 3/2019 | Marsollek |
| 2020/0124991 | A1 | 4/2020 | Butler |
| 2021/0405358 | A1 | 12/2021 | Knauf et al. |
| 2021/0405542 | A1 | 12/2021 | Nefzi et al. |
| 2021/0405543 | A1 | 12/2021 | Nefzi et al. |

FOREIGN PATENT DOCUMENTS

| | | |
|---|---|---|
| DE | 10 2017 207 433 A1 | 4/2018 |
| DE | 10 2018 200 528 A1 | 12/2018 |
| WO | WO 2018/015079 A1 | 1/2018 |
| WO | WO 2018/141520 A1 | 8/2018 |
| WO | WO 2018/166745 A1 | 9/2018 |
| WO | WO 2018/192759 A1 | 10/2018 |

OTHER PUBLICATIONS

U.S. Appl. No. 17/354,116, filed Jun. 22, 2021, Eylem Bektas Knauf.
U.S. Appl. No. 17/354,160, filed Jun. 22, 2021, Marwène Nefzi.
U.S. Appl. No. 17/354,204, filed Jun. 22, 2021, Marwène Nefzi.
German Office Action, with translation thereof, for corresponding DE Appl No. 10 2020 208 011.9, dated Jan. 26, 2021.

* cited by examiner

COMPENSATION OF CREEP EFFECTS IN AN IMAGING DEVICE

CROSS-REFERENCE TO RELATED APPLICATIONS

This application claims priority under 35 U.S.C. § 119 to German patent application No. 10 2020 208 011.9, filed Jun. 29, 2020, the entire contents of which are incorporated by reference herein.

FIELD

The present disclosure relates to a microlithographic optical arrangement suitable for utilizing UV used light, such as light in the extreme ultraviolet (EUV) range. Furthermore, the disclosure relates to an optical imaging device including such an arrangement. The disclosure can be used in conjunction with any desired optical imaging methods, such as in the production or the inspection of microelectronic circuits and the optical components used for that purpose (for example optical masks).

BACKGROUND

The optical devices used in conjunction with the production of microelectronic circuits typically include a plurality of optical element units including one or more optical elements, such as lens elements, mirrors or optical gratings, which are arranged in the imaging light path. The optical elements typically cooperate in an imaging process in order to transfer an image of an object (for example a pattern formed on a mask) to a substrate (for example a so-called wafer). The optical elements are typically combined in one or more functional groups held, if appropriate, in separate imaging units. In the case of principally refractive systems that operate with a wavelength in the so-called vacuum ultraviolet range (VUV, for example at a wavelength of 193 nm), such imaging units are often formed from a stack of optical modules holding one or more optical elements. The optical modules typically include a supporting structure having a substantially ring-shaped outer supporting unit, which supports one or more optical element holders, the latter in turn holding the optical element.

The ever-advancing miniaturization of semiconductor components generally results in a constant demand for increased resolution of the optical systems used for their production. This demand for increased resolution can cause a demand for an increased numerical aperture (NA) and an increased imaging accuracy of the optical systems.

One approach for obtaining an increased optical resolution involves reducing the wavelength of the light used in the imaging process. The trend in recent years has increasingly fostered the development of systems in which light in the so-called extreme ultraviolet (EUV) range is used, typically at wavelengths of 5 nm to 20 nm, in most cases at a wavelength of approximately 13 nm. In this EUV range it is generally no longer possible to use conventional refractive optical systems. This is owing to the fact that in this EUV range the materials used for refractive optical systems generally have an absorbance that is too high to achieve acceptable imaging results with the available light power. Consequently, in this EUV range it is generally desirable to use reflective optical systems for the imaging.

This transition to purely reflective optical systems having a high numerical aperture (e.g. NA>0.4) in the EUV range can present challenges with regard to the design of the imaging device.

The factors mentioned above can result in very stringent desired properties with regard to the position and/or orientation of the optical elements participating in the imaging relative to one another and also with regard to the deformation of the individual optical elements in order to achieve a desired imaging accuracy. Moreover, it is generally desirable to maintain this high imaging accuracy over operation in its entirety, ultimately over the lifetime of the system.

As a consequence, it is desirable for the components of the optical imaging device (i.e., for example, the optical elements of the illumination device, the mask, the optical elements of the projection device and the substrate) which cooperate during the imaging to be supported in a well-defined manner in order to maintain a predetermined well-defined spatial relationship between these components and to obtain a minimal undesired deformation of these components in order ultimately to achieve the highest possible imaging quality.

A challenge in this case often relates to undertaking the most precise possible measurement of the relative situation (i.e., the position and/or orientation) of the optical components (e.g., the optical elements) involved in the imaging and actively setting the relative situation of at least some of these optical elements by way of an appropriately controlled relative situation control device with the precision (typically in the region of 1 nm or less) and control bandwidth (typically up to 200 Hz) used for the imaging process. In this case, a factor for the precision of the measurement is the stable and precise support of the measuring device used for the measurement. Where possible, it is desirable for this support to ensure that the components of the measuring device have a well-defined relative situation (i.e., position and/or orientation) in relation to a defined reference to which the measurement result of the measuring device is related.

An option frequently used in this context is that of supporting the measuring device on a separate supporting structure, which is often also referred to as "sensor frame" or "metrology frame". In this case, such a sensor frame is typically supported on a further (single-part or multi-part) load-bearing structure (often also referred to as a "force frame") which, in addition to the sensor frame, also supports at least some of the optical components (e.g., at least some of the optical elements) of the imaging device by way of the relative situation control device. This can ensure that the sensor frame can be kept largely clear from the support loads for the optical components.

To keep the sensor frame relatively free from internal disturbances of the imaging device (e.g., vibrations induced by moving components) and external disturbances (e.g., unwanted shocks) in this case, the sensor frame is frequently supported on the load-bearing structure in vibration-isolated or vibration-decoupled fashion by way of a vibration decoupling device. Typically, this is implemented by way of a plurality of supporting spring devices of the vibration decoupling device.

While this approach can achieve good dynamic vibration isolation of the sensor frame (on short time scales), it was found, however, that, over long time scales, so-called creep effects or settling effects can arise in the area of the vibration decoupling device, such as in the area of the supporting spring devices. As a result of this, in the long term, relative to the load-bearing structure, there can be a change in the relative situation of the sensor frame and hence a change in the relative situation of the reference used for controlling the relative situation control device. Such a change in the static relative situation of the reference is typically compensated for by the relative situation control device during operation;

however, it is desired that the latter provides sufficient travel to this end, and consequently a sufficient motion reserve, and accordingly has a correspondingly complicated or expensive design.

SUMMARY

The disclosure seeks to provide a microlithographic optical arrangement and a corresponding optical imaging device including such an arrangement, and a corresponding method, which reduce, and possibly avoid, limitations of known technology, and, for example, facilitate optical imaging with the highest possible imaging quality in the simplest and most cost-effective manner.

The disclosure involves the technical teaching of being able to obtain optical imaging of high imaging quality in a simple and cost-effective manner if, for the purposes of compensating a change in a static relative situation between the first supporting structure and the second supporting structure in at least one correction degree of freedom, a length of the supporting spring device along the supporting force direction of the supporting spring device is actively altered or a distance of the interfaces of the supporting spring device from the first supporting structure and the second supporting structure along the supporting force direction of the supporting spring device is actively altered.

Within the meaning of the present disclosure, the term "change in static relative situation" should be understood to mean that this is the change in the relative situation or a drift between the first supporting structure and the second supporting structure, which is present in the purely static state, i.e., without dynamical excitation of the structures. As will still be explained in more detail below, such a change in static relative situation or drift can be detected by way of suitable methods which filter out short-term or dynamical influences. By way of example, there can be simple averaging of the relative situation information over suitably long periods of time.

In the case of conventional designs, there can be, depending on the extent of the change in static relative situation, a comparatively pronounced static (or non-dynamic) deflection of the relative situation control device and hence of the optical elements from their original initial relative situation, by which this change in relative situation is compensated for, hence the optical elements follow this change in relative situation. This can go so far that the relative situation control device is no longer able to supply the travel involved for the dynamic relative situation control of the optical elements during operation since it reaches its limits in this respect.

In conventional designs, this conflict is solved by virtue of the relative situation control device being designed with correspondingly large room for maneuver, which allows it to react accordingly over the service life of the imaging device. However, this can be linked to comparatively high costs since a displacement movement with correspondingly high dynamics, generally, can only be realized with comparatively great outlay. The part of the dynamic room for maneuver of the relative situation control device, with which the optical elements follow the change in static relative situation, is ultimately thus wasted from a cost point of view.

In contrast, using the present correction or compensation, it can be easily possible to return or reset the second supporting structure, and hence the reference, back to its initial state (or to the vicinity thereof), as exhibited after an initial adjustment of the imaging device (typically immediately during first-time start-up of the imaging device), after a certain relatively long time of operation, over which the creep or settling effects have had a noticeable effect on the support of the second supporting structure. As a consequence, even the relative situation control device, which follows the reference, or the optical elements carried by the relative situation control device can then be returned back to their initial state. Consequently, a drift of the relative situation control device can be at least substantially removed.

As a result, it is possible, for example, in a simple manner, to keep the maximum used or possible travel of the relative situation control device relatively small or restricted to the bare minimum. For example, there is no need to keep a large motion reserve for the compensation of long-term creep or settling effects. This motion reserve can be kept significantly smaller.

According to one aspect, the disclosure relates to an arrangement of a microlithographic optical imaging device, for example, for using light in the extreme UV (EUV) range, including a first supporting structure and a second supporting structure, wherein the first supporting structure is configured to support at least one optical element of the imaging device. The first supporting structure supports the second supporting structure by way of a plurality of supporting spring devices of a vibration decoupling device, wherein the supporting spring devices act kinematically parallel to one another between the first supporting structure and the second supporting structure. Each of the supporting spring devices defines a supporting force direction, along which it exerts a supporting force between the first supporting structure and the second supporting structure, and defines a supporting length along the supporting force direction. The second supporting structure supports a measuring device which is configured to measure the position and/or orientation of the at least one optical element in relation to a reference, for example, a reference of the second supporting structure, in at least one degree of freedom up to all six degrees of freedom in space. Furthermore, provision is made of a creep compensation device for compensating a change in a static relative situation between the first supporting structure and the second supporting structure in at least one correction degree of freedom, wherein the change in relative situation, for example, is caused by a change in length of at least one of the supporting spring devices along their supporting force direction, which arises from a creep process of the supporting spring device. The creep compensation device includes a controllable active adjustment device with at least one active adjustment element, configured to alter a length of the supporting spring device along the supporting force direction of the supporting spring device. In addition or as an alternative thereto, the active adjustment device is configured to alter a distance of the interfaces of the supporting spring device with the first supporting structure and the second supporting structure along the supporting force direction of the supporting spring device.

In general, the adjustment device can be designed in any suitable way for obtaining the desired length compensation or distance compensation. In some embodiments, the active adjustment device includes a force actuator as an active adjustment element. Using such a force actuator, it is possible, for example, to obtain a tuning of the adjustment device to the vibration isolation behavior of the supporting spring devices.

In addition or as an alternative thereto, the active adjustment device can include a Lorentz actuator as an active adjustment element. With this, it is possible, for example, to obtain a tuning of the adjustment device to the vibration isolation behavior of the supporting spring devices. In addition or as an alternative thereto, the active adjustment device can include a pneumatic actuator, for example, a pneumatic bellows actuator, as an active adjustment element. With all of these embodiments, in each case on its own or in any combination matched to the respective application, it is possible to obtain relatively simple configurations.

In addition or as an alternative thereto, the active adjustment device can include a displacement actuator as an active adjustment element. This can be desirable because the influence on the vibration isolation behavior of the supporting spring devices can be kept low and can consequently remain substantially unchanged. For example, the active adjustment device can include a piezoelectric adjustment element as an active adjustment element, by which relatively simple and robust configurations can be obtained. For example, the active adjustment device can include a piezoelectric stepper drive (a so-called "piezo crawler"). Likewise, the displacement actuator can be an electrostrictive actuator.

In certain embodiments, the active adjustment device can include a hydraulic actuator, for example, a hydraulic bellows actuator, as an active adjustment element, the hydraulic actuator ultimately being able to act as a displacement actuator in the case of a corresponding incompressibility of the work medium employed. Holding the adjustment element in a positioning state once the latter has been set can then easily be implemented by a corresponding locking element (for example, a locking valve or the like) in the line or lines for the work medium connected to the hydraulic actuator. In this case, relatively simple check valves can be used if positioning movements are only expected or involved in one direction.

In certain embodiments, the active adjustment device includes an active piezoelectric adjustment element as an active control member, wherein the at least one piezoelectric active control member generates a positioning movement in a positioning direction by ferroelectric domain switching when a voltage is applied. Here, optionally, the at least one piezoelectric adjustment element may have a first extent in the positioning direction before the voltage is applied. When a voltage is applied, the at least one piezoelectric adjustment element is then brought into a positioning state with a second extent in the positioning direction, the first extent differing from the second extent. After removing the voltage, the at least one piezoelectric adjustment element then is in a holding state, in which it maintains the second extent in a non-energized state. A feature thereof is that the adjustment element is supplied only briefly with the corresponding control power and then maintains its new state over the remaining time without power being supplied.

In certain embodiments, the at least one active adjustment element may have a first extent in the positioning direction prior to the control of the active adjustment device and the at least one adjustment element may be brought into a positioning state with a second extent in the positioning direction by controlling the active adjustment device, the first extent differing from the second extent. In this case, it is then possible to provide a holding device, such as a clamping device, which, for example, can be switchable, wherein the holding device is configured to hold the at least one active adjustment element in a holding state following the removal of the control of the active adjustment device, the active adjustment element then maintaining the second extent in such holding state without being controlled. With this, it is therefore easily possible to fix a positioning state in which the change in relative situation was at least partly compensated (i.e., a compensation state). Where applicable, this can be implemented in such a way that no further supply of power then is involved in the holding state.

Optionally, the holding device has a configuration so as to be self-retaining in the positioning direction. This self-retaining property can be obtained in any suitable manner. Optionally, the holding device includes at least two wedge elements, which are arranged and configured in such a way that, when the active adjustment device is controlled by at least one adjustment unit of the at least one active adjustment element, the two wedge elements are displaced against one another in a displacement direction extending transversely to the positioning direction. In this case, the two wedge elements can slide on one another, such as during the displacement, and generate a positioning movement in the positioning direction in the process. Relatively simple and robust configurations can be achieved herewith.

In certain embodiments, the at least one active adjustment element is a component of the at least one supporting spring device, which can be arranged at any suitable point within the supporting spring device. It can be desirable for the at least one active adjustment element is, for example, part of a coupling unit of two mechanical spring units of the at least one supporting spring device.

In certain embodiments, the at least one active adjustment element can be configured to adjust a first interface unit of the first supporting structure with the at least one supporting spring device along the supporting force direction. In addition or as an alternative thereto, the at least one active adjustment element can be configured to adjust a second interface unit of the second supporting structure with the at least one supporting spring device along the supporting force direction.

In some embodiments, a control device is provided, which is configured to control, in a creep compensation mode, the active adjustment device for compensating the change in relative situation on the basis of the change in length of the at least one supporting spring device along its supporting force direction. In this case, the change in length of the at least one supporting spring device can be established in any suitable way. Thus, any one or more suitable detection variables can be detected by way of appropriate detection devices, which allow conclusions to be drawn about the change in length. Likewise, the control device can additionally or alternatively use a creep model of the supporting spring device, which describes the creep behavior of the supporting spring device, to determine the change in length of the at least one supporting spring device along its supporting force direction.

In certain embodiments, a detection device and a control device are provided, wherein the detection device is configured to detect at least one relative situation detection value which is representative for the relative situation between the first supporting structure and the second supporting structure in at least one correction degree of freedom and output the relative situation detection value to the control device. In a creep compensation mode, the control device is configured to control the adjustment device to compensate the change in relative situation, on the basis of the relative situation detection value, for example, on the basis of a change in the relative situation detection value over time.

In general, control of the adjustment device in a creep compensation mode can be implemented at any suitable time or triggered by any temporal events (e.g., specifiable intervals) and/or non-temporal events (e.g., detected shock loads, reaching a certain number of imaging procedures, starting up or shutting down the imaging device, etc.).

In certain embodiments, the control device is configured to activate the creep compensation mode if a relative situation change represented by relative situation change information or a relative situation detection value exceeds a specifiable limit value. As a result of this, it is naturally possible to react relatively efficiently and in needs-based fashion to the creep or settling effects.

Additionally or alternatively, the control device can be configured to activate the creep compensation mode on the basis of specifiable events, for example, at specifiable time intervals, wherein the creep compensation mode is activated, for example, 1 hour to 10 years (e.g., 24 hours to 3 years, 1 month to 1 year) following the first operation of the imaging device and/or a preceding activation of the creep compensation mode.

In general, the control device can be designed in any suitable manner in order to realize a control of the adjustment device that is adapted to the respective optical imaging process. Here, simple open loop control can be realized. However, closed loop control can also be realized, within which, for example, any suitable control bandwidths can be provided for controlling the adjustment device.

The degree of freedom or the degrees of freedom in which there is a change in relative situation relevant to the imaging process or the imaging errors thereof as a result of creep or settling effects can be any degrees of freedom, up to all six degrees of freedom in space. Here, any suitable limit values can be specified, which, when exceeded, involve or trigger the control of the adjustment device.

In certain embodiments, the at least one degree of freedom of the change in relative situation is a rotational degree of freedom, for example, a rotational degree of freedom about a tilt axis extending transversely to the direction of gravity. The specifiable limit value then can be representative for a deviation of the relative situation between the first supporting structure and the second supporting structure from a specifiable relative target situation by 0.1 μrad to 1000 μrad (e.g., 1 μrad to 200 μrad, 10 μrad to 100 μrad). In addition or as an alternative thereto, the at least one degree of freedom of the change in relative situation can be a translational degree of freedom, for example, a translational degree of freedom along the direction of gravity. The specifiable limit value then can be representative for a deviation of the relative situation between the first supporting structure and the second supporting structure from a specifiable relative target situation by 0.1 μm to 1000 μm (e.g., 1 μm to 200 μm, 10 μm to 100 μm).

The present disclosure also relates to an optical imaging device, for example, for microlithography, including an illumination device including a first optical element group, an object device for receiving an object, a projection device including a second optical element group and an image device, wherein the illumination device is configured to illuminate the object and the projection device is configured to project an image of the object onto the image device. The illumination device and/or the projection device includes at least one arrangement according to the disclosure. This makes it possible to realize the embodiments and features described above to the same extent, and so reference is made to the explanations given above in this respect.

The present disclosure furthermore relates to method for a microlithographic optical imaging device, for example, for using light in the extreme UV (EUV) range, wherein a first supporting structure supports a second supporting structure by way of a plurality of supporting spring devices of a vibration decoupling device and is configured to support at least one optical element of the imaging device. The supporting spring devices act kinematically parallel to one another between the first supporting structure and the second supporting structure. Each of the supporting spring devices defines a supporting force direction, along which it exerts a supporting force between the first supporting structure and the second supporting structure, and defines a supporting length along the supporting force direction. The second supporting structure supports a measuring device which is configured to measure the position and/or orientation of the at least one optical element in relation to a reference, for example, a reference of the second supporting structure, in at least one degree of freedom up to all six degrees of freedom in space. A change in a static relative situation between the first supporting structure and the second supporting structure is compensated for in at least one degree of freedom in a compensation step, wherein the change in relative situation, for example, is caused by a change in length of at least one of the supporting spring devices along the supporting force direction, which arises from a creep process of the supporting spring device. Here, a length of the supporting spring device along the supporting force direction of the supporting spring device is altered by an active adjustment element of an active adjustment device and/or a distance of the interfaces of the supporting spring device with the first supporting structure and the second supporting structure along the supporting force direction of the supporting spring device is altered by an active adjustment element of an active adjustment device. This likewise makes it possible to realize the embodiments and features described above to the same extent, and so reference is made to the explanations given above in this respect.

Optionally, at least one piezoelectric adjustment element of the active adjustment device is controlled in the compensation step, wherein, for example, a voltage is applied to the at least one piezoelectric adjustment element and the at least one piezoelectric adjustment element generates a positioning movement in a positioning direction by ferroelectric domain switching when the voltage is applied.

In some embodiments, the at least one piezoelectric adjustment element has a first extent in the positioning direction prior to the application of the voltage, wherein the at least one piezoelectric adjustment element is brought into a positioning state with a second extent in the positioning direction when the voltage is applied, the first extent differing from the second extent. Then the voltage is removed. After the voltage has been removed, the at least one piezoelectric adjustment element is in a holding state, in which it maintains the second extent in a non-energized state.

In certain embodiments, the at least one active adjustment element has a first extent in the positioning direction before the active adjustment device is controlled. In the compensation step, by controlling the active adjustment device, the at least one adjustment element is then brought into a positioning state with a second extent in the positioning direction, the first extent differing from the second extent. After the control of the active adjustment device has been removed, the at least one active adjustment element is then held, for example, clamped, in a holding state, in which the active adjustment element maintains the second extent without being controlled.

Further aspects and exemplary embodiments of the disclosure are evident from the dependent claims and the following description of exemplary embodiments, which refers to the accompanying figures. All combinations of the disclosed features, irrespective of whether or not they are the subject of a claim, lie within the scope of protection of the disclosure.

DETAILED DESCRIPTION OF EXEMPLARY EMBODIMENTS

Figure 1:
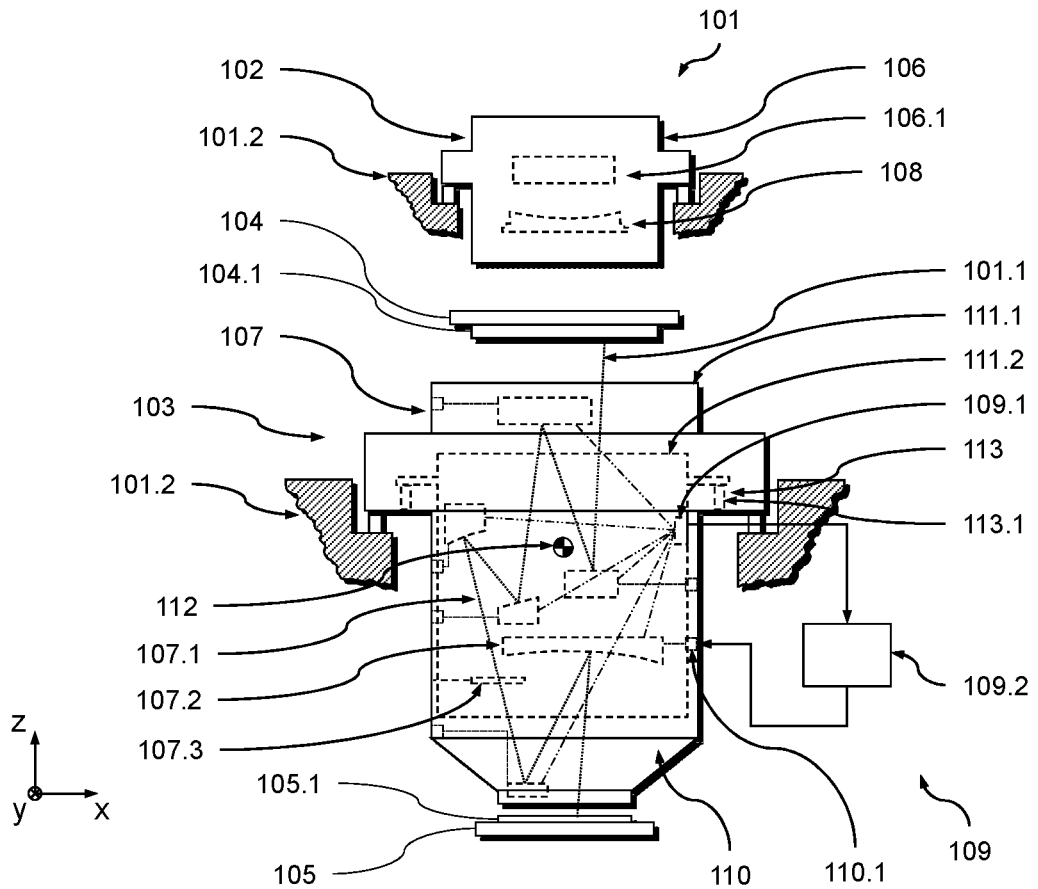
FIG. 1 is a schematic illustration of an embodiment of an optical imaging device according to the disclosure, which includes an embodiment of an optical arrangement according to the disclosure.

Exemplary embodiments of an optical imaging device according to the disclosure in the form of a microlithographic projection exposure apparatus 101, which include exemplary embodiments of an optical arrangement according to the disclosure, are described below with reference to FIGS. 1 to 6. To simplify the following explanations, an x, y, z coordinate system is indicated in the drawings, the z direction running counter to the direction of gravitational force. It goes without saying that it is possible in further configurations to choose any desired other orientations of an x, y, z coordinate system.

FIG. 1 is a schematic, not-to-scale illustration of the projection exposure apparatus 101, which is used in a microlithographic process for producing semiconductor components. The projection exposure apparatus 101 includes an illumination device 102 and a projection device 103. The projection device 103 is designed to transfer an image of a structure of a mask 104.1, which is disposed in a mask unit 104, onto a substrate 105.1, which is disposed in a substrate unit 105, in an exposure process. For this purpose, the illumination device 102 illuminates the mask 104.1. The optical projection device 103 receives the light from the mask 104.1 and projects the image of the mask structure of the mask 104.1 onto the substrate 105.1, such as for example a wafer or the like.

The illumination device 102 includes an optical unit 106 with an optical element group 106.1. The projection device 103 includes a further optical unit 107 with an optical element group 107.1. The optical element groups 106.1, 107.1 are disposed along a folded central ray path 101.1 of the projection exposure apparatus 101. Each optical element group 106.1, 107.1 can include any plurality of optical elements.

In the present exemplary embodiment, the projection exposure apparatus 101 operates with used light in the EUV range (extreme ultraviolet radiation), with wavelengths of between 5 nm and 20 nm, for example, with a wavelength of 13 nm. The optical elements of the element groups 106.1, 107.1 of the illumination device 102 and the projection device 103 are therefore exclusively reflective optical elements. The optical element groups 106.1, 107.1 may include one or more optical arrangements according to the disclosure, as is described below with reference to the optical arrangement 108. The optical units 106 and 107 are each supported by way of a base structure 101.2.

In further configurations of the disclosure, it is also possible (for example, depending on the wavelength of the illumination light), of course, to use any type of optical elements (refractive, reflective, diffractive) alone or in any desired combination for the optical modules.

The arrangement according to the disclosure is described in exemplary fashion below with reference to the arrangement 108, which is a part of the projection device 103. In the imaging device 101 there are, inter alia, very strict desired properties with respect to the position and/or orientation of the optical elements of the optical element group 107.1 of the projection device 103 relative to one another in order to attain a desired imaging accuracy. Moreover, it is desirable to maintain this high imaging accuracy over operation in its entirety, ultimately over the lifetime of the system.

As a consequence, it is desirable for the optical elements of the optical element group 107.1 to be supported in a well-defined fashion in order to observe a specified well-defined spatial relationship between the optical elements of the element group 107.1 and the remaining optical components and in order thus to ultimately attain the highest possible imaging quality.

To this end, in the present example the relative situation (i.e., the position and/or orientation) of the optical elements of the element group 107.1 is measured via a measuring device 109.1 (illustrated only in much simplified fashion in FIG. 1) of a control device 109. The measuring device 109.1 feeds its measurement signals LMS to a control unit 109.2 of the control device 109. On the basis of the measurement signals LMS of the measuring device 109.1, the control unit 109.2 then controls a relative situation control device 110, which is supported on a load-bearing first structure 111.1. Then, by way of the relative situation control device 110, the relative situation of each optical element of the element group 107.1 is actively adjusted with respect to a central reference 112 with the precision (typically in the region of 1 nm and less) and the control bandwidth (typically up to 200 Hz) involved for the imaging process.

Figure 2:
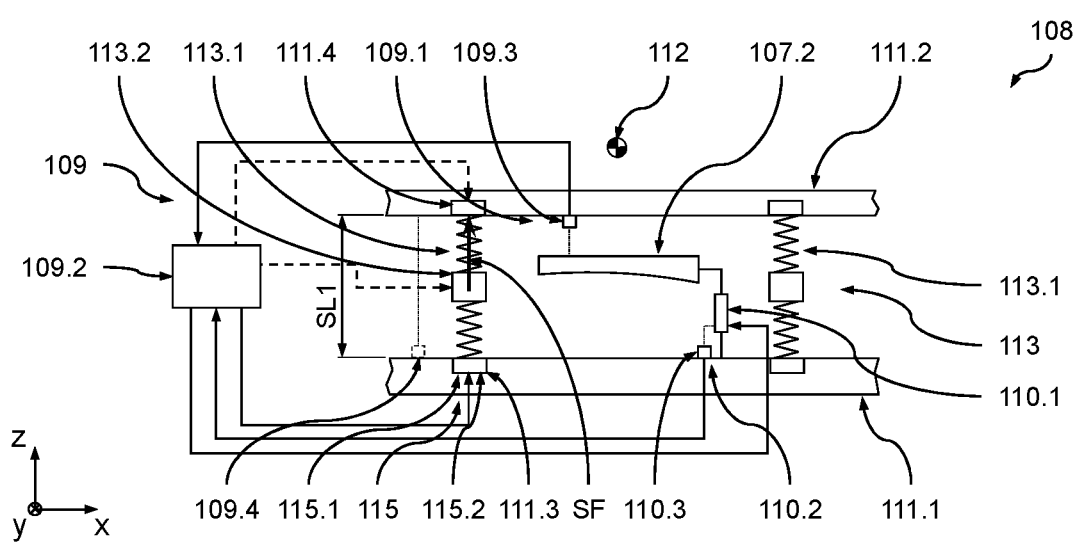
FIG. 2 is a schematic view of a part of the imaging device from FIG. 1 in a first state.

In the present example, the measuring device 109.1 outputs to the relative situation control device 110 measurement information MI which is representative for the respective position and/or orientation of the respective optical element of the element group 107.1 in relation to the reference 112 in at least one degree of freedom in space. In the state of the first-time start-up of the imaging device 101 (in which the imaging device 101 is in a first operating state OM1), the control unit 109.2 consequently accordingly controls the relative situation control device 110 on the basis of the measurement information MI in order to generate a first target state S1 of the position and/or orientation of the optical elements of the element group 107.1 in relation to the reference 112, as illustrated in FIG. 2 for an optical element 107.2 of the element group 107.1.

A factor for the attainable imaging quality of the imaging device 101 is the precision of the measurement of the measuring device 109.1, which in turn depends on a support of the measuring device 109.1 that is as stable and precise as possible. Where possible, this support should ensure that the components of the measuring device 109.1 have a well-defined relative situation (i.e., position and/or orientation) in relation to the central reference 112 to which the measurement result of the measuring device 109.1 is related.

To this end, the measuring units 109.3 of the measuring device 109.1 are supported on a separate second supporting structure 111.2, which is frequently also referred to as a sensor frame. The sensor frame 111.2 in turn is supported on the (single-part or multi-part) load-bearing first structure 111.1. This can ensure that the sensor frame 111.2 can be kept largely clear from the support loads for the optical elements of the element group 107.1.

To keep the sensor frame 111.2 as free as possible from internal disturbances of the imaging device 101 (e.g., vibrations induced by moving components) and external disturbances (e.g., unwanted shocks), the sensor frame 111.2 is supported on the load-bearing structure 111.1 in vibration-isolated or vibration-decoupled fashion by way of a vibration decoupling device 113. This is implemented by way of a plurality of supporting spring devices 113.1 of the vibration decoupling device 113, wherein the supporting spring devices 113.1 act kinematically parallel to one another between the load-bearing first supporting structure 111.1 and the sensor frame 111.2. Each of the supporting spring devices 113.1 defines a supporting force direction SFR, along which it exerts a supporting force SF between the first supporting structure 111.1 and the second supporting structure 111.2, and defines a supporting length SL1 along the supporting force direction SFR.

Figure 3:
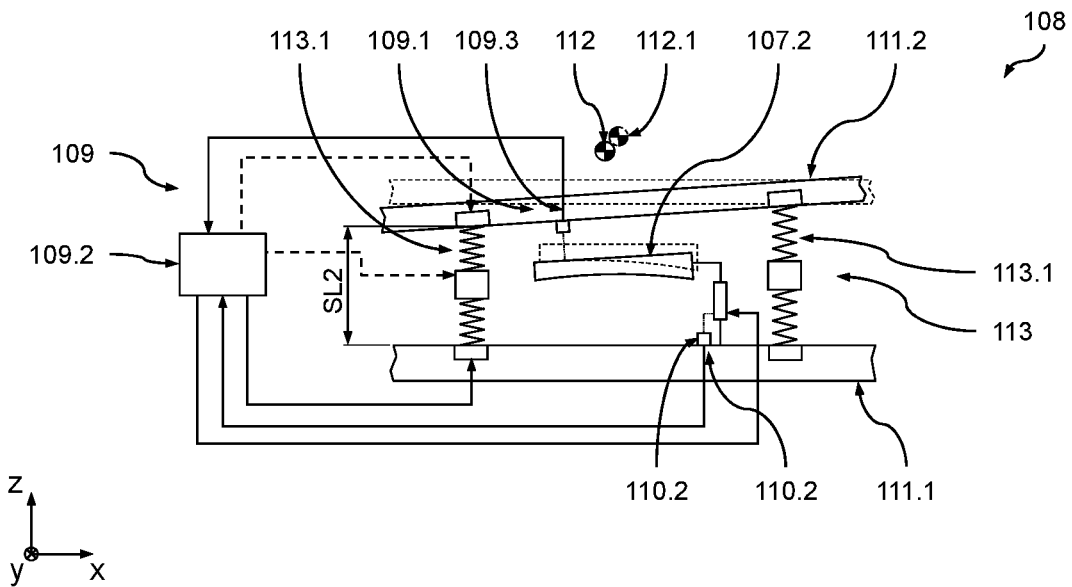
FIG. 3 is a schematic view of the part of the imaging device from FIG. 2 in a second state.
Figures 4, 5:
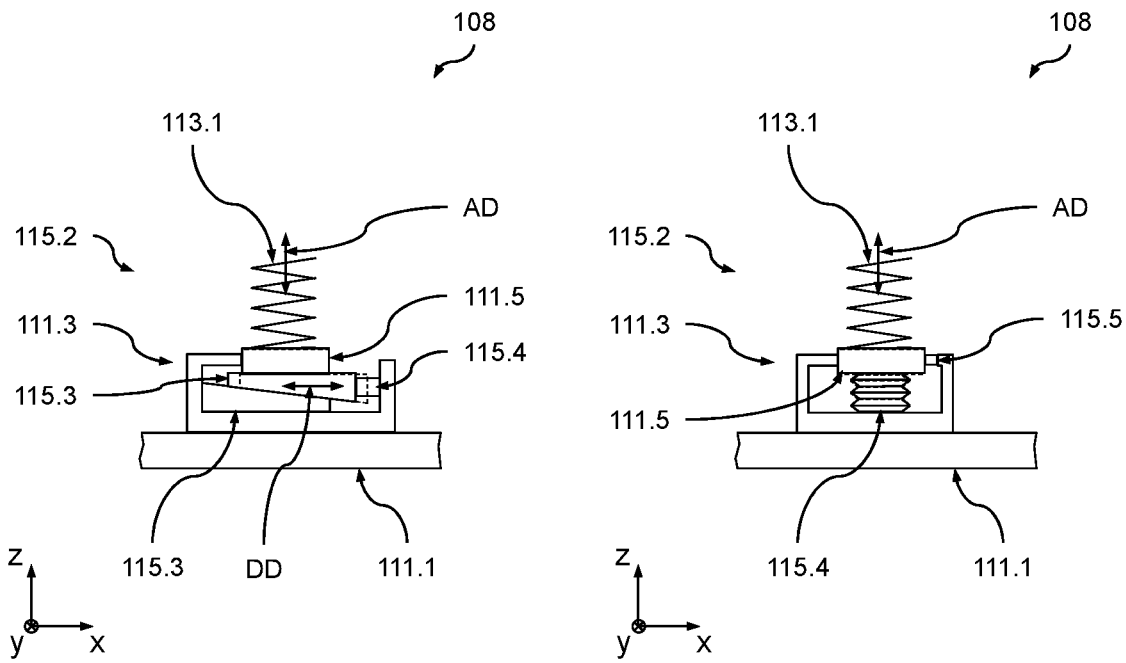
FIG. 4 is a schematic view of the part of one embodiment of the imaging device from FIG. 2.
FIG. 5 is a schematic view of the part of one embodiment of the imaging device from FIG. 2.

While this can achieve good dynamic vibration isolation or vibration decoupling of the sensor frame 111.2 from the load-bearing first supporting structure 111.1 (on short time scales), it was found, however, that, over long time scales, so-called creep effects or settling effects can arise in the area of the vibration decoupling device 113, such as in the region of the supporting spring devices 113.1. As a result of this, the supporting length of the supporting spring devices 113.1 changes in the long-term (as indicated in FIGS. 3 and 4 by the length SL2) and hence there is a change both in the relative situation of the sensor frame 111.2 and in the relative situation of the reference 112 used for controlling the relative situation control device 110 with respect to the load-bearing structure 111.1 (in relation to the initial relative situation indicated in FIG. 3 by the contour 112.1). This is illustrated (in very much exaggerated fashion) in FIG. 3. In general, such a change in relative situation of the reference 112 can be compensated for by the relative situation control device 110 during normal operation of the imaging device 101 by virtue of the optical elements of the element group 107.1 being adjusted to follow the reference 112 (as illustrated in FIG. 3). However, such a compensation of the change in relative situation of the reference 112 by the relative situation control device 110 over the service life of the imaging device 101 would involve sufficient travel, hence a sufficient motion reserve of the relative situation control device 110, as a result of which the latter can have a correspondingly complicated or expensive design.

To avoid this, in the present example, a creep compensation device 115 is provided for compensating such a change in the static relative situation between the first supporting structure 111.1 and the second supporting structure 111.2 in at least one correction degree of freedom. The creep compensation device 115 includes an active adjustment device 115.1 with an active adjustment element 115.2, which is controllable by the control unit 109.2. The active adjustment device 115.1 is configured to alter a distance of the interfaces 111.3 and 111.4 of the respective supporting spring device 113.1 with the first supporting structure 111.1 and the second supporting structure 111.2 along the supporting force direction SF of the supporting spring device 113.1 in order to attain an at least partial compensation of the change in relative situation.

To this end, the active adjustment element 115.2 is integrated into the interfaces 111.3 of the respective supporting spring device 113.1 with the first supporting structure 111.1 in the present example. In other embodiments, an active adjustment element 115.2 can additionally or alternatively also be integrated in the interfaces 111.4 of the respective supporting spring device 113.1 with the second supporting structure 111.2 and can be controlled accordingly (as indicated by the dashed control line in FIGS. 2 and 3).

Likewise, in addition or as an alternative to the aforementioned embodiments, an active adjustment element 115.2 can be integrated in a unit 113.2 of the respective supporting spring device 113.1. In this case, the active adjustment device 115.1 is configured to alter a length of the supporting spring device 113.1 in the supporting force direction SF of the supporting spring device 113.1 under control of the control unit 109.2 (as indicated by the dashed control line in FIGS. 2 and 3) and thus attain an at least partial compensation of the change in relative situation.

The control device 109, in the present example, detects relative situation change information RSCI which is representative for a change in the static relative situation between the load-bearing first supporting structure 110.1 and the second supporting structure 110.2 in at least one degree of freedom. The control device 109 has a creep compensation mode CCM in which the active adjustment device 115.1 is controlled by the control unit 109.2 to alter the distance of the interfaces 111.3 and 111.4 via the adjustment element 115.2 on the basis of the relative situation change information RSCI (typically to reduce a distance in order to compensate a shortening of the supporting spring device 113.1 as a consequence of creep or settling effects). In this case, the positioning movement of the adjustment element 115.2 is chosen in such a way that the sensor frame 111.2 is returned back to the initial state illustrated in FIG. 2. The active adjustment device 115.1, in a second mode of operation OM2 that follows the creep compensation mode CCM, then remains in this adjusted state.

It is understood that the control of the adjustment device 115.1 can be realized both as a closed loop control circuit (in which the relative situation change information RSCI is actually detected by way of appropriate detection signals) and as an open loop controlled system (in which the relative situation change information RSCI is determined by way of an appropriate model, for example), as this will be explained in more detail below.

Using this correction or compensation, it is possible, for example, in a simple manner to return the sensor frame 111.2, the reference 12 and hence the relative situation control device 110 (and the optical elements of the element group 107.1, for example the optical element 107.2, carried thereby) after a certain relatively long period of operation (over which the creep or settling effects have had a noticeable effect on the support of the second supporting structure 110.2) back to their initial state (or to the vicinity thereof), which they had following an initial adjustment of the imaging device (typically immediately during the first-time start-up of the imaging device 101), consequently in the first operating state OM1.

As a result, it is possible, for example, in a simple manner, to keep the maximum involved or possible travel of the relative situation control device 110 relatively small or restricted to the bare minimum. For example, there is no need to keep a large motion reserve for the compensation of long-term creep or settling effects by the relative situation control device 110. This motion reserve can be kept significantly smaller and, for example, be restricted to a value to be expected for the duration of the first mode of operation OM1.

It is understood that the adjustment element 115.2 can be controlled any desired number of times and that it is consequently possible to switch into the creep compensation mode CCM as often as desired. Using this, it is possible to obtain a correspondingly operational behavior over the entire service life of the imaging device 101.

In general, the change in relative situation or the associated relative situation change information RSCI can be determined in any suitable manner. The relative situation control device 110 can include, for example, a deflection detection device 110.2 connected to the control unit 109.2. The deflection detection device 110.2 detects deflection information DI, which is representative for a deflection of the optical element 107.2 in relation to the first supporting structure 111.1 in at least one degree of freedom from the first initial state. The control device 109 then derives the relative situation change information RSCI from the deflection information DI, for example, on the basis of a change in the deflection information DI over time.

For example, the relative situation control device 110 can include a number of relative situation control actuators 110.1 for actively adjusting the optical element 107.2, of which actuators only one relative situation control actuator 110.1 is respectively illustrated in FIGS. 2 and 3 for reasons of clarity. In typical embodiments, a plurality of relative situation control actuators 110.1 are provided which act between the first supporting structure 111.1 and the optical element 107.1 in the manner of a parallel kinematic system. By way of example, six relative situation control actuators 110.1 ca be provided, which act in the manner of a hexapod kinematic system.

By way of example, a deflection detection device 110.2 can detect adjustment information VI, which is representative for an adjustment of the respective relative situation control actuator 110.1 from the adjusted first initial state. The control device 109.1 can then derive the relative situation change information RSCI from the adjustment information VI, for example, on the basis of a change in the adjustment information VI over time.

Furthermore, the deflection detection device 110.2 can include at least one adjustment sensor 110.3, which is assigned to the respective relative situation control actuator 110.1. The adjustment sensor 110.3 outputs adjustment sensor information VSI, which is representative for the positioning movement of the relative situation control actuator 110.1, for example, a change in length of the relative situation control actuator 110.1. The control device 109 can then derive the adjustment information VI from the adjustment sensor information VSI. It is understood that, in general, any number of adjustment sensors 110.3 can be provided per relative situation control actuator 110.1 in order to determine the adjustment information VI. In the present example, at least two adjustment sensors 110.3 are assigned to the respective relative situation control actuator 110.1 since this allows a relatively reliable, error-tolerant determination of the adjustment information VI.

However, it is understood that the adjustment information VI can in general also be detected in any other suitable manner in other embodiments (in addition or as an alternative to the use of the adjustment sensors 110.3). Thus, for example, the control signals for the respective one relative situation control actuator 110.2 may be detected and stored without gaps in a history starting from the first initial state and the adjustment information VI may be determined from this history of the control signals.

In certain embodiments, the control device 109 can optionally also include an imaging error detection device (not illustrated in more detail here), which produces at least one imaging error information IEI, which is representative for an imaging error of the imaging device. The control device 109 then derives the relative situation change information RSCI from the imaging error information IEI, for example, on the basis of a change in the imaging error information IEI over time. These embodiments use a known relationship between the imaging error of the imaging device and the change in static relative situation between the first supporting structure 111.1 and the second supporting structure 111.2 caused by creep or settling effects. Thus, certain changes in relative situation can cause characteristic imaging errors, which consequently have a characteristic fingerprint, which was determined in advance from theory and/or by simulation. These characteristic imaging errors or fingerprints can then be used to deduce an actual change in relative situation in the control device 109 during operation.

A relatively clear relationship between the imaging error and such a change in relative situation arises, for example, in the case of embodiments in which the optical imaging device 101 further includes passive optical components which are involved with the imaging but which are not actively adjusted by way of the relative situation control device 110, but instead are connected in a substantially rigid fashion to the first supporting structure 111.1 during operation. This is indicated in FIG. 1 by the contour 107.3, which represents a stop. In this case, only the actively adjusted optical elements of the element group 107.1 are repositioned by the relative situation control device 110 to follow the change in relative situation while the passive components, such as the stop 107.3, remain in their relative situation thus yielding a change in relative situation between the optical components 107.1 and 107.3, which is accompanied by a characteristic imaging error.

In further embodiments, the control device 109 can additionally or alternatively include a relative situation detection device, as indicated in FIG. 2 by the contour 109.4. In this case, the relative situation detection device 109.4 generates at least one relative situation information item RSI which is representative for the relative situation between the first supporting structure 111.1 and the second supporting structure 111.2 in at least one degree of freedom, the information being output to the control unit 109.2. The control device 109 then derives the relative situation change information RSCI from the relative situation information RSI, for example, on the basis of a change in the relative situation information RSI over time. In this way, it is possible to realize relatively simple and precise detection of the relative situation change information RSCI.

While the above-described embodiments each realize a closed loop control circuit, a embodiment with an open loop controlled system can also be realized, as mentioned above. Thus, in certain embodiments, the control device 109 can also use a creep model CM of the supporting spring device 113 to determine the relative situation change information RSCI in certain embodiments, wherein the creep model CM of the supporting spring device 113 describes the creep behavior of the supporting spring device 113. From this creep behavior, which is known with sufficient accuracy, the relative situation change information RSCI can possibly be determined without a further sensor system and can be used directly for the control. However, in further embodiments the creep model CM can also be used for checking the plausibility of the relative situation change information RSCI, which was determined in another way, such as is described above or below.

It should be mentioned again at this point that the embodiments described above or below for determining the relative situation change information RSCI can be combined in any manner as a matter of principle, for example in order to obtain consolidated (e.g., averaged) relative situation change information RSCI. In addition or as an alternative thereto, individual embodiments for determining the relative situation change information RSCI can naturally also be used to check the plausibility of the results of the other embodiments for determining the relative situation change information RSCI.

In general, controlling the adjustment element 115.2 can furthermore be implemented at any suitable time or triggered by any temporal events (e.g., specifiable intervals) and/or non-temporal events (e.g., detected shock loads, reaching a certain number of imaging procedures, starting up or shutting down the imaging device 101, etc.).

In the present example, the control device 109 activates the creep compensation mode CCM if the relative situation change represented by the relative situation change information RSCI exceeds a specifiable limit value LIM (i.e., if the following applies: RSCI>LIM). As a result of this, it is naturally possible to react relatively efficiently and in needs-based fashion to the creep or settling effects.

Additionally or alternatively, the control device 109 can activate the creep compensation mode CCM, as mentioned, on the basis of specifiable events, for example, at specifiable time intervals, wherein the creep compensation mode is activated, for example, 1 hour to 10 years (e.g., 24 hours to 3 years, 1 month to 1 year) following the first operation of the imaging device 101 and/or a preceding activation of the creep compensation mode CCM.

In general, the control device 109 can be designed in any suitable manner in order to realize a control of the relative situation control device 110 that is adapted to the respective optical imaging process of the imaging device 101. In the process, simple open loop control can be realized, as mentioned. However, closed loop control can also be realized, within which any suitable control bandwidths can be provided for controlling the relative situation control device 110.

The degree of freedom or the degrees of freedom DOF in which there is a change in relative situation relevant to the imaging process or the imaging errors thereof as a result of creep or settling effects can be any degrees of freedom, up to all six degrees of freedom in space. Here, any suitable limit values can be specified, which, when exceeded, involve or trigger the control of the adjustment element 115.2.

In certain embodiments, the at least one degree of freedom DOF of the change in relative situation is a rotational degree of freedom, for example, a rotational degree of freedom about a tilt axis extending transversely to the direction of gravity. The specifiable limit value then can be representative for a deviation of the relative situation between the first supporting structure 111.1 and the second supporting structure 111.2 from a specifiable relative target situation by 0.1 μrad to 1000 μrad (e.g., 1 μrad to 200 μrad, 10 μrad to 100 μrad). In addition or as an alternative thereto, the at least one degree of freedom DOF of the change in relative situation can be a translational degree of freedom, for example, a translational degree of freedom along the direction of gravity. The specifiable limit value then can be representative for a deviation of the relative situation between the first supporting structure 111.1 and the second supporting structure 111.2 from a specifiable relative target situation by 0.1 μm to 1000 μm (e.g., 1 μm to 200 μm, 10 μm to 100 μm).

In general, the adjustment device 115.1 can be designed in any suitable way for generating the compensation movement. Here, the stiffness of the adjustment device 115.1 can naturally be matched to the stiffness of the supporting spring devices 113.1 in order to obtain the desired decoupling effect of the vibration decoupling device 113 in the involved decoupling degrees of freedom. Optionally, the adjustment device 115.1 is designed in such a way that it has the smallest possible influence on the stiffness of the support of the sensor frame 111.2 in these decoupling degrees of freedom, in which the vibration decoupling device 113 should provide decoupling.

In the present example, an active piezoelectric adjustment element is used as active adjustment element 115.2, the piezoelectric adjustment element 115.2 producing a positioning movement in its positioning direction by way of ferroelectric domain switching when a voltage U is applied. The piezoelectric adjustment element 115.2 initially has a first extent DIM1 in its positioning direction before the voltage is applied (by the control unit 109.2). When the voltage U is applied, the piezoelectric adjustment element 115.2 is then brought into a positioning state with a second extent DIM2 in the positioning direction, the first extent DIM1 differing from the second extent DIM2 in such a way that the desired compensation movement is obtained (with DIM2 typically being greater than DIM1, i.e., the following applies: DIM1<DIM2). After removing the voltage U, the piezoelectric adjustment element 115.2 then is in a holding state, in which it maintains the second extent DIM2 in a non-energized state. A feature thereof is that the adjustment element 115.2 involves being supplied only briefly with the corresponding control power and then maintains its new state over the remaining time without power being supplied.

Optionally, an adjustment element 115.2 of the adjustment device 115.1 may only be assigned to individual supporting spring devices 113.1. Naturally, this can be implemented in coordination with an expected creep or settling behavior of the supporting spring devices 113.1. It is desirable for, like in the present example, an adjustment element 115.2 to be assigned to each of the supporting spring devices 113.1. In this way, a relatively simple coordination with simple needs-based compensation of creep or settling effects is possible.

In further embodiments, as a matter of principle, any other suitable adjustment elements 115.2 can also be used to generate the positioning movement. Thus, the active adjustment element 115.2 can include a force actuator, for example a Lorentz actuator or a pneumatic bellows actuator. In addition or as an alternative thereto, the active adjustment element 115.2 can include a further displacement actuator.

In the embodiment of FIG. 4 described below, a wedge drive with a holding device with a configuration that is self-retaining in the positioning direction AD is used as the adjustment element 115.2. The self-retaining drive is implemented by way of two wedge elements 115.3, which are arranged and configured in such a way that they are displaced against one another transversely to the positioning direction AD in a displacement direction DD by an adjustment unit 115.4 of the adjustment element 115.2 when the adjustment device 115.1 is controlled. Here, the two wedge elements 115.3 can slide on one another during the displacement and thus generate a positioning movement in the positioning direction AD for an interface element 111.5 with the supporting spring device 113.1 (as indicated in FIG. 4 by the dashed contours). With this, a relatively simple and robust self-retaining configuration is obtained, in which the adjustment element 115.2 no longer need be supplied with power after the positioning movement has been generated.

In the embodiment of FIG. 5 described below, for the adjustment element 115.2, a pneumatic bellows actuator is used as an adjustment unit 115.4 of the adjustment element 115.2. The bellows actuator 115.4 acts on an interface element 111.5 with the supporting spring device 113.1 in the positioning direction AD and, thereby, generates a positioning movement thereof in the positioning direction AD (as indicated in FIG. 5 by the dashed contours).

In this case, a holding device 115.5 in the form of a clamping device is provided, which is configured to hold the adjustment element 115.2 in the holding state after removing the control (illustrated in FIG. 5), in which the active adjustment element maintains the second extent DIM2 without being controlled. The holding device 115.5 can have a passive design and exert the clamping force on the interface element 111.5 at all times (with the bellows actuator 115.4 then having to overcome the clamping force during the positioning movement). Optionally, the holding device 115.5 is configured to be switchable by the control unit 109.2. Optionally, the control is implemented here for intermittent release of the clamping during the creep compensation mode CCM.

In further embodiments, for the adjustment element 115.2, a hydraulic bellows actuator can be used as an adjustment unit 115.4 of the adjustment element 115.2, the hydraulic bellows actuator then acting as a displacement actuator in the case of a corresponding incompressibility of the work medium employed. Then, the clamping device 115.5 may be dispensed with where applicable. The holding device can easily be realized by an appropriate locking valve in the line or lines for the work medium attached to the bellows actuator. In this case, relatively simple check valves can be used if positioning movements are only expected or involved in one direction.

Any actuator that is appropriately controlled by the control unit 109.2 can be used for the respective adjustment unit 115.4 of FIGS. 4 and 5. Here, it is possible to use the above-described closed loop control (which monitors the attainment of the state illustrated in FIG. 2 as control target), or else an open loop controlled system. The latter can be used, for example, if use is made of a displacement actuator with a sufficiently well-known positioning behavior. For example, a piezoelectric stepper drive (so-called "piezo crawler") can be used for the adjustment unit 115.4.

Figure 6:
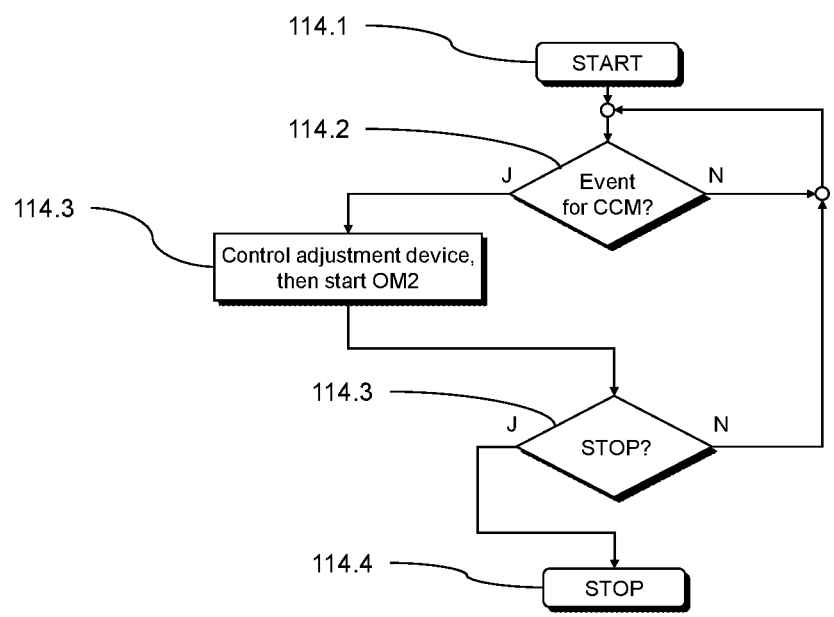
FIG. 6 is a flowchart of an exemplary embodiment of a method according to the disclosure, which can be carried out using the imaging device from FIG. 1.

Using the designs described above, it is possible to perform the method according to the disclosure as described above. Here, as shown in FIG. 6, the procedure is initially started in a step 114.1. This is carried out, for example, with the first-time start-up of the imaging device 101, with the imaging device then being in the first operating state OM1.

Then, in a step 114.2, a check is carried out within the control device 109 as to whether one of the above-described events, which triggers the activation of the creep compensation mode CCM, has occurred. This check is repeated if this is not the case. However, if this is the case, the active adjustment device 115.1 is controlled in the above-described manner using the control device 109 in a step 114.3, wherein the control device 109 then puts the imaging device 101 into the second operating state OM2 (which then replaces the first operating state OM1). Then, in a step 114.3, a check is carried out in the control device 109 as to whether the procedure should be terminated. If not, there is a jump back to the step 114.2. Otherwise, the procedure is terminated in a step 114.4. Otherwise, reference is made to the explanations above with respect to further details of the method so as to avoid repetition.

In the foregoing, the present disclosure was only described on the basis of examples in which the relative situation of each optical element of the element group 107.1 was actively adjusted in relation to the central reference 112. However, it is understood that in other embodiments only some of the optical elements (possibly even only one optical element) of the element group 107.1 can be actively adjusted directly in relation to the central reference 112 while the remaining optical elements of the element group 107.1 are actively adjusted relative to one of these optical elements that has been actively adjusted with respect to the central reference 112. For example, only one of the optical elements of the element group 107.1 can serve as a reference element and can be directly actively adjusted with respect to the central reference 112, while all other optical elements of the element group 107.1 are actively adjusted relative to this reference element (and hence only indirectly with respect to the central reference 112).

The present disclosure has been described above exclusively on the basis of examples from the area of microlithography. However, it is understood that the disclosure can also be used in the context of any other optical applications, for example, imaging methods at different wavelengths, in which similar problems arise with respect to the support of heavy optical units.

Furthermore, the disclosure can be used in connection with the inspection of objects, such as for example so-called mask inspection, in which the masks used for microlithography are inspected for their integrity, etc. In FIG. 1, a sensor unit, for example, which detects the imaging of the projection pattern of the mask 104.1 (for further processing), then takes the place of the substrate 105.1. This mask inspection can then take place substantially at the same wavelength as is used in the later microlithographic process. However, it is similarly possible also to use any desired wavelengths deviating therefrom for the inspection.

What is claimed is:

1. An arrangement, comprising:
   an optical element;
   a first supporting structure supporting the optical element;
   a second supporting structure;
   a vibration decoupling device comprising a plurality of supporting spring devices;
   a measuring device configured to measure a position and/or an orientation of the optical element in relation to a reference in at least one degree of freedom up to all six degrees of freedom in space; and
   a creep compensation device configured to compensate a change in a static relative situation between the first and second supporting structures in at least one correction degree of freedom,
   wherein:
   the first supporting structure supports the second supporting structure via the plurality of supporting spring devices;
   the supporting spring devices act kinematically parallel to one another between the first and second supporting structures;
   for each supporting spring device, the supporting spring device defines a supporting force direction along which it exerts a supporting force between the first and second supporting structures;
   for each supporting spring device, the supporting spring device defines a supporting length along the supporting force direction of the supporting spring device;
   the second supporting structure supports the measuring device;
   the change in relative situation is due to a change in length of a supporting spring device along its supporting force direction which is due to a creep process of the supporting spring device;

the creep compensation device comprises a controllable active adjustment device;

the controllable active adjustment device comprises an active adjustment element, and at least one of the following holds:
   i) the active adjustment device is configured to alter a length of the supporting spring device along the supporting force direction of the supporting spring device, and the active adjustment element is integrated into one of the supporting spring devices; and
   ii) the active adjustment device is configured to alter a distance of interfaces of the supporting spring device with the first supporting structure and with the second supporting structure along the supporting force direction of the supporting spring device, and the active adjustment element is integrated into one of the interfaces; and the arrangement is an arrangement of a microlithographic optical imaging device.

2. The arrangement of claim 1, wherein the active adjustment element comprises a member selected from the group consisting of a force actuator, a displacement actuator, a piezoelectric adjustment element, a Lorentz actuator, a hydraulic actuator, and a pneumatic actuator.

3. The arrangement of claim 1, wherein the active adjustment element comprises an active piezoelectric adjustment element configured to generate a positioning movement in a positioning direction via ferroelectric domain switching when a voltage is applied.

4. The arrangement of claim 3, wherein:
the piezoelectric adjustment element has a first extent in the positioning direction before the voltage is applied;
the piezoelectric adjustment element has a second extent in the positioning direction when the voltage is applied;
the second extent is different from the first extent; and
the piezoelectric adjustment element maintains the second extent after the voltage has been removed.

5. The arrangement of claim 1, wherein:
the active adjustment element has a first extent in the positioning direction before the active adjustment device is controlled;
the active adjustment element has a second extent in the positioning direction when the active adjustment device is controlled;
the second extent is different from the first extent;
the arrangement further comprises a holding device configured to hold the active adjustment element at the second extent after control of the active adjustment device is removed.

6. The arrangement of claim 5, wherein the holding device is self-retaining in the positioning direction.

7. The arrangement of claim 1, wherein at least one of the following holds:
the active adjustment element is configured to adjust an interface unit of the first supporting structure with the supporting spring device along its supporting force direction; and
the active adjustment element is configured to adjust an interface unit of the second supporting structure via the supporting spring device along its supporting force direction.

8. The arrangement of claim 1, further comprising a control device configured to control the active adjustment device based on a change in length of the supporting spring device along its supporting force direction.

9. The arrangement of claim 8, wherein the control device is configured to use a creep model of the supporting spring device, which describes the creep behavior of the supporting spring device, to determine the change in length of the at least one supporting spring device along its supporting force direction.

10. The arrangement of claim 1, further comprising:
a detection device configured to detect at least one relative situation detection value representative of the relative situation between the first and second supporting structures; and
a control device configured to control the active adjustment device based on the relative situation detection value.

11. The arrangement of claim 10, wherein the control device is configured to control the active adjustment device only when a deviation of the relative situation detection value from a specifiable relative situation target value exceeds a limit value.

12. The arrangement of claim 11, wherein at least one of the following holds:
the correction degree of freedom is a rotational degree of freedom, and the specifiable limit value is representative of a deviation of the relative situation between the first and second supporting structures from the target value by 0.1 µrad to 1000 µrad; and
the correction degree of freedom is a translational degree of freedom, and the specifiable limit value is representative for a deviation of the relative situation between the first and second supporting structures from the target value by 0.1 µm to 1000 µm.

13. The arrangement of claim 1, wherein one of the following holds:
the correction degree of freedom is a rotational degree of freedom about a tilt axis extending transversely to the direction of gravity; and
the at least one correction degree of freedom is a translational degree of freedom along the direction of gravity.

14. The arrangement of claim 1, wherein the measuring device is configured to measure a position and/or an orientation of the optical element in relation to a reference of the second supporting structure in at least one degree of freedom up to all six degrees of freedom in space.

15. An optical imaging device, comprising:
an illumination device comprising a first optical element group; and
a projection device comprising a second optical element group,
wherein:
   the illumination device is configured to illuminate an object;
   the projection device is configured to project an image of the object onto a substrate; and
   at least one member selected from the group consisting of the illumination device and the projection device comprises an arrangement according to claim 1.

16. A method of using a microlithographic optical imaging device comprising an illumination device and a projection device, the illumination device comprising a first optical element group, and the projection device comprising a second optical element group, the method comprising:
using the illumination device to illuminate an object; and
using the projection device to project an image of the object onto a substrate, wherein at least one member selected from the group consisting of the illumination device and the projection device comprises an arrangement according to claim 1.

17. The arrangement of claim 1, wherein the active adjustment element is configured to alter the length of the supporting spring device along the supporting force direction of the supporting spring device, and the active adjustment element is integrated into the supporting spring device.

18. The arrangement of claim 1, wherein the active adjustment element is configured to alter the a distance of interfaces of the supporting spring device with the first supporting structure and with the second supporting structure along the supporting force direction of the supporting spring device, and the active adjustment element is integrated into one of the interfaces.

19. A method of operating a microlithographic optical imaging device comprising a first supporting structure supporting a second supporting structure via a plurality of supporting spring devices of a vibration decoupling device, the first supporting structure supporting an optical element of the imaging device, the supporting spring devices acting kinematically parallel to one another between the first and second supporting structures, each supporting spring device defining a supporting force direction along which it exerts a supporting force between the first and second supporting structures, each supporting spring device defining a supporting length along its supporting force direction, the second supporting structure supporting a measuring device configured to measure a position and/or an orientation of the optical element in relation to a reference in at least one degree of freedom up to all six degrees of freedom in space, the method comprising:
  compensating for a change in a static relative situation between the first and second supporting structures by using an active adjustment element,
  wherein at least one of the following holds:
   i) the active adjustment device alters a length of a supporting spring device along its supporting force direction, and the active adjustment element is integrated into one of the supporting spring devices; and/or
   ii) the active adjustment device alters a distance of interfaces of the supporting spring device with the first supporting structure and the second supporting structure along the supporting force direction of the supporting spring device, and the active adjustment element is integrated into one of the interfaces, and
  wherein the change in relative situation is due to a change in length of the supporting spring device along its supporting force direction due to a creep process of the supporting spring device.

20. The method of claim 19, further comprising applying a voltage to the piezoelectric adjustment element so that the piezoelectric adjustment element moves in a positioning direction via ferroelectric domain switching.

21. The method of claim 20, further comprising removing the voltage, wherein removing the voltage does not change an extent of the piezoelectric adjustment element along the positioning direction.

22. The method of claim 19, further comprising:
  controlling the piezoelectric element to change its extent along a positioning direction from a first extent to a second extent different from the first extent; and
  stopping control of the piezoelectric element,
  wherein, after stopping control of the piezoelectric element, holding the piezoelectric element so that the piezoelectric element maintains the second extent along the positioning direction.

* * * * *

UNITED STATES PATENT AND TRADEMARK OFFICE
CERTIFICATE OF CORRECTION

PATENT NO. : 11,703,770 B2
APPLICATION NO. : 17/354212
DATED : July 18, 2023
INVENTOR(S) : Eylem Bektas Knauf et al.

Page 1 of 1

It is certified that error appears in the above-identified patent and that said Letters Patent is hereby corrected as shown below:

On the Title Page

Column 2, Line 2, before "supporting" insert -- second --.

In the Claims

Column 21, Line 10, Claim 18, delete "the a" and insert -- the --.

Signed and Sealed this
Third Day of October, 2023

*Katherine Kelly Vidal*
Katherine Kelly Vidal
*Director of the United States Patent and Trademark Office*